US012778295B2

(12) United States Patent
Shi

(10) Patent No.: US 12,778,295 B2
(45) Date of Patent: Nov. 3, 2026

(54) LEVELING FOOT ASSEMBLY FOR EQUIPMENT RACK

(71) Applicant: SCHNEIDER ELECTRIC IT CORPORATION, Foxboro, MA (US)

(72) Inventor: Yang Shi, Shanghai (CN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 122 days.

(21) Appl. No.: 18/794,231

(22) Filed: Aug. 5, 2024

(65) Prior Publication Data

US 2025/0049212 A1 Feb. 13, 2025

(30) Foreign Application Priority Data

Aug. 7, 2023 (CN) ......................... 202310986475.1

(51) Int. Cl.
*A47B 91/02* (2006.01)
*B60B 33/00* (2006.01)
*H05K 7/14* (2006.01)

(52) U.S. Cl.
CPC ........ *A47B 91/022* (2013.01); *B60B 33/0089* (2013.01); *H05K 7/1488* (2013.01)

(58) Field of Classification Search
CPC ....... A47B 91/02; A47B 91/022; A47B 91/16; A47B 91/024; A47B 91/026; A47B 91/028; B60B 33/0007; B60B 33/0089; H05K 7/1488; H05K 7/1489; H05K 7/1485; H05K 7/1491; H05K 7/1497; H05K 7/18; H05K 7/183; H05K 7/186
See application file for complete search history.

(56) References Cited

U.S. PATENT DOCUMENTS 1,386,317 A * 8/1921 Claassen ................. B60B 33/04 16/21
2,803,510 A * 8/1957 Carbary .................. B60B 33/06 16/34
3,441,974 A * 5/1969 Dean ...................... F16M 11/24 16/33
4,037,291 A * 7/1977 Huempfner ........... B60B 33/025 16/35 R
4,249,282 A * 2/1981 Little ...................... B60B 33/06 280/43.1

(Continued)

FOREIGN PATENT DOCUMENTS

CN 105793634 B 1/2018
CN 219396644 U 7/2023

(Continued)

OTHER PUBLICATIONS

Extended European Search Report from corresponding European Application No. 24193246.6 dated Dec. 11, 2024.

*Primary Examiner* — Patrick D Hawn
(74) *Attorney, Agent, or Firm* — Kinney & Lange, P.A.

(57) ABSTRACT

A leveling foot assembly includes a foot and a rod secured to the foot. The rod includes a first threaded portion, a second threaded portion, and a third threadless portion positioned between the first threaded portion and the second threaded portion. The leveling foot assembly further includes a leveling nut configured to engage the first threaded portion of the rod when the foot is in a raised position and configured to engage the second threaded portion of the nut when the foot is in a lowered position.

17 Claims, 5 Drawing Sheets

(56) References Cited

U.S. PATENT DOCUMENTS

| | | | | | |
|---|---|---|---|---|---|
| 4,798,359 | A * | 1/1989 | Ball | F16M 7/00 248/649 | |
| 4,915,334 | A * | 4/1990 | White | F16M 7/00 248/188.4 | |
| 5,332,182 | A * | 7/1994 | Weisz | G01G 23/002 248/188.4 | |
| 5,490,648 | A * | 2/1996 | Cullen | A47B 91/02 248/188.5 | |
| 5,934,485 | A * | 8/1999 | Harris | H04Q 1/112 361/829 | |
| 6,407,351 | B1 * | 6/2002 | Meyer | F16M 7/00 248/188.4 | |
| 6,637,071 | B2 * | 10/2003 | Sorensen | B60B 33/04 16/33 | |
| 6,871,826 | B2 * | 3/2005 | Oyama | A47B 91/02 248/188.4 | |
| 6,892,784 | B2 * | 5/2005 | Maas | A47G 5/00 52/239 | |
| 7,096,533 | B2 * | 8/2006 | Griepentrog | B60B 33/04 16/35 R | |
| 7,293,666 | B2 | 11/2007 | Mattlin et al. | | |
| 7,350,269 | B2 * | 4/2008 | Dominic | B60B 33/0002 16/30 | |
| 7,472,970 | B2 * | 1/2009 | Bergesch | H05K 7/1488 312/223.1 | |
| 7,484,700 | B2 * | 2/2009 | Selle | A47B 91/024 248/346.11 | |
| 7,744,049 | B2 * | 6/2010 | Kwon | A47B 91/16 312/351.3 | |
| 7,744,050 | B2 * | 6/2010 | de Toledo | F16M 7/00 248/650 | |
| 8,632,038 | B2 * | 1/2014 | Christian | A47B 91/00 248/188.4 | |
| 8,820,688 | B2 * | 9/2014 | Nara | G03B 21/145 248/188.4 | |
| 10,146,295 | B2 | 12/2018 | Palmer et al. | | |
| 10,356,935 | B2 * | 7/2019 | Segroves | A47B 91/026 | |
| 10,517,187 | B1 * | 12/2019 | Chen | H05K 7/1427 | |
| 10,716,400 | B2 * | 7/2020 | Jones | A47B 91/002 | |
| 11,051,617 | B2 * | 7/2021 | Cheng | A47B 91/024 | |
| 11,818,862 | B1 * | 11/2023 | Krietzman | H05K 7/18 | |
| 12,048,108 | B1 * | 7/2024 | Lewis, II | H05K 5/0234 | |
| 12,049,248 | B2 * | 7/2024 | Love | A61B 50/13 | |
| 2005/0116134 | A1 * | 6/2005 | Lee | D06F 37/20 248/650 | |
| 2008/0178543 | A1 * | 7/2008 | Maas | E04B 2/7425 52/234 | |

FOREIGN PATENT DOCUMENTS

| | | | | | |
|---|---|---|---|---|---|
| DE | 202018100013 | U1 * | 1/2018 | A47B 9/08 | |
| EP | 0722681 | A2 * | 7/1996 | A47B 91/028 | |
| EP | 1803984 | A2 * | 7/2007 | F16M 7/00 | |
| EP | 2120673 | B1 | 8/2010 | | |
| EP | 4414138 | A1 * | 8/2024 | B25H 1/04 | |
| FR | 2827139 | A1 * | 1/2003 | A47B 91/16 | |
| JP | H09272304 | A * | 10/1997 | | |
| KR | 101739790 | B1 * | 5/2017 | A47B 91/04 | |
| KR | 20190021882 | A * | 3/2019 | A47B 13/00 | |
| TW | M334208 | U * | 6/2008 | | |
| TW | M610421 | U * | 4/2021 | | |
| TW | M612161 | U * | 5/2021 | | |
| TW | M668879 | U * | 4/2025 | | |
| WO | WO-2008105013 | A2 * | 9/2008 | A47B 91/024 | |

* cited by examiner

LEVELING FOOT ASSEMBLY FOR EQUIPMENT RACK

CROSS-REFERENCE TO RELATED APPLICATIONS

This application claims priority under 35 U.S.C. § 119 to Chinese Application No. 202310986475.1 titled "LEVELING FOOT ASSEMBLY FOR EQUIPMENT RACK," filed on Aug. 7, 2023, which is hereby incorporated by reference in its entirety.

BACKGROUND OF THE INVENTION

1. Field of the Invention

The present invention relates to enclosures and equipment racks, and more particularly to enclosures and equipment racks used to house data processing, networking and telecommunications equipment.

2. Discussion of Related Art

Equipment racks or enclosures for electronic equipment, such as data processing, networking and telecommunications equipment have been in use for years. Such equipment racks are typically moved in place by rolling the equipment rack on casters provided at the bottom of the equipment rack. Specifically four casters are provided at the four corners of the bottom of the equipment rack to provide proper support of the equipment rack during transport. Once positioned, to remove the weight of the equipment rack off of the casters, and to maintain the equipment rack in a level position, four leveling feet are provided at the bottom of the equipment rack. The leveling feet are provided at the four corners of the equipment rack as well, adjacent to their respective casters. FIG. 1 illustrates a corner of an equipment rack 2 having a caster wheel 4 and a leveling foot 6.

Currently, most leveling feet have no top access because of the limited space between a leveling nut associated with the leveling foot and a bottom frame of the equipment rack. A person installing the equipment rack typically adjusts the leveling foot by rotating the leveling nut from a side of the leveling foot. This is a slow and inconvenient process since the installer must adjust each leveling foot of the equipment rack to extend the leveling foot past the caster wheel(s). Rotating the leveling foot so that a rod of the leveling foot passes through the leveling nut along an entire length of the rod is time-consuming and inconvenient.

SUMMARY OF THE INVENTION

One aspect of the present disclosure is directed to a leveling foot assembly comprising a foot and a rod secured to the foot. The rod includes a first threaded portion, a second threaded portion, and a third threadless portion positioned between the first threaded portion and the second threaded portion. The leveling foot assembly further comprises a leveling nut configured to engage the first threaded portion of the rod when the foot is in a raised position and configured to engage the second threaded portion of the nut when the foot is in a lowered position.

Embodiments of the leveling foot assembly further may include a spring configured to move the rod to the lowered position. The leveling foot assembly further may include a spring configured to move the rod to the lowered position when threads of the leveling nut disengage threads of the first threaded portion. The spring further may be configured to engage a shoulder of the second threaded portion to move the rod to the lowered position. The leveling nut may be fixedly secured and the rod rotates with respect to the leveling nut. The leveling nut may be fixedly secured to a frame of a rack equipment rack. The leveling foot assembly further may include a rotating nut fixedly secured to the rod, with the rotating nut being located between the foot and the first threaded portion of the rod. The foot, when the leveling nut engages the first threaded portion of the rod when the foot is in the raised position, may be positioned above a caster wheel of an equipment rack. The leveling nut may be fixedly secured to a frame of a rack equipment rack and the rotating nut may be fixedly secured to the rod, with the rod being configured to rotate with respect to the leveling nut. The leveling foot assembly further may include a spring configured to bias the rod to the lowered position, with the spring being configured to move the rod to the lowered position when the leveling nut disengages the first threaded portion. The spring further may be configured to engage a shoulder of the second threaded portion to bias the rod to the lowered position. The leveling nut, when moving the rod from the raised position to the lowered position, may travel over the third threadless portion without interference.

Another aspect of the present disclosure is directed to a method of positioning a leveling foot assembly. In one embodiment, the method comprises: providing a rod secured to a foot, the rod being configured to be moved between a raised position and a lowered position; rotating the rod, when the rod is in the raised position, to disengage threads of a first threaded portion of the rod from threads of a leveling nut; once disengaged, moving the rod to the lowered position to position threads of a second threaded portion of the rod next to the threads of the leveling nut; and rotating the rod to engage threads of the second threaded portion of the rod with the threads of the leveling nut.

Embodiments of the method further may include biasing the rod with a spring, which is provided to move the rod to the lowered position. The leveling nut may be fixedly secured to a frame of a rack equipment rack. The rotating nut may be located between the foot and the first threaded portion of the rod. The foot, when the leveling nut engages the first threaded portion of the rod when the foot is in the raised position, may be positioned above a caster wheel of an equipment rack. The further may include securing the leveling nut to a frame of a rack equipment rack and securing the rotating nut to the rod, with the rod being configured to rotate with respect to the leveling nut. The leveling nut, when moving the rod from the raised position to the lowered position, may travel over a third threadless portion of the rod without interference, with the third threadless portion being positioned between the first threaded portion and the second threaded portion. The method further may include returning the rod to the raised position by rotating the rod to disengage the threads of the second threaded portion of the rod from the threads of the leveling nut, moving the rod to the raised position to position the threads of the first threaded portion next to the threads of the leveling nut, and rotating the rod to engage the threads of the first threaded portion of the rod with the threads of a leveling nut.

The present invention will be more fully understood after a review of the following figures, detailed description and claims.

BRIEF DESCRIPTION OF THE DRAWINGS

For a better understanding of the present invention, reference is made to the figures which are incorporated herein by reference and in which.

DETAILED DESCRIPTION OF THE PREFERRED EMBODIMENTS

Figure 1:
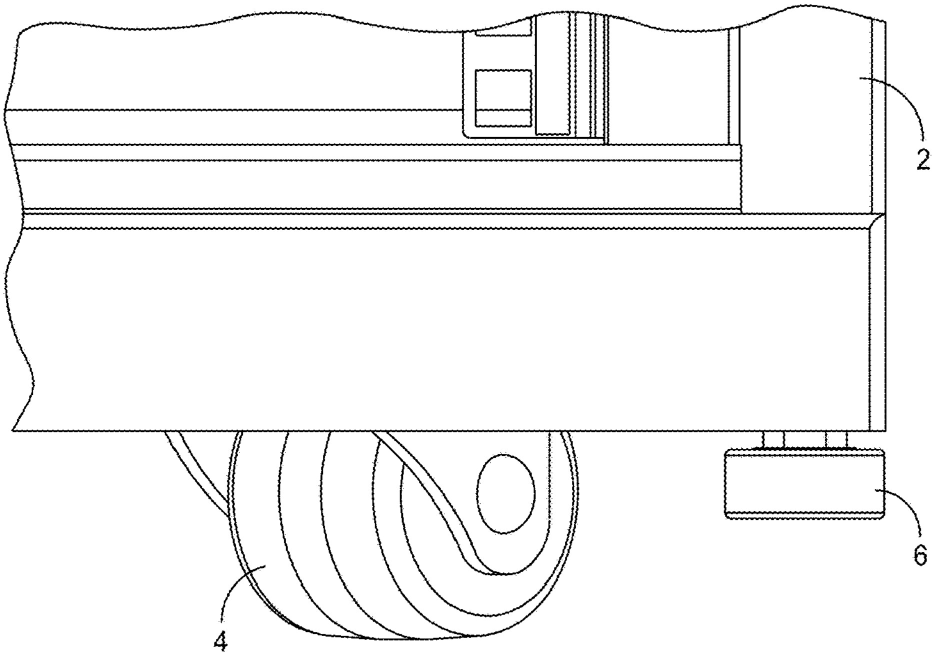
FIG. 1 (PRIOR ART)
FIG. 1 is a perspective view of a portion of an equipment rack having caster wheels and a leveling foot of a known embodiment.

For the purposes of illustration only, and not to limit the generality, the present invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

Embodiments of the present disclosure are directed to a leveling foot assembly of an equipment rack that enables a person deploying leveling feet of the equipment rack to avoid having to rotate the entire thread of the rode when adjusting the leveling foot. In a certain embodiment, a spring is provided to bias the leveling foot from a raised or retracted position to a lowered or extended position to assist the person installing the leveling foot in an efficient and expedient manner. The leveling foot assembly is designed to assist the customer in avoiding having to rotate or unscrew the entire rod when adjusting the leveling foot.

Equipment racks are provided to support electronic equipment, such as data processing and networking equipment (e.g., servers, server blades, associated power distribution equipment, etc.) and telecommunication equipment. In some embodiments, the equipment rack is a rectangular, box-like structure that is configured such that it can be assembled with or connected to other, similarly shaped structures. In certain embodiments, the equipment rack has a front door assembly, a rear door assembly, a pair of side walls, a bottom wall and a top cover or "roof" panel. The equipment rack can be adjustably configurable to accommodate equipment having a variety of shapes and sizes.

As noted above with reference to FIG. 1, a bottom of a frame of the equipment rack includes caster wheels provided at the four corners of the equipment rack. In some embodiments a single caster wheel is provided at each corner of the equipment rack. In other embodiments, two or more caster wheels are employed at each corner of the equipment rack. To remove the weight of the equipment rack off of the caster wheels, and to maintain the equipment rack in a level position, four leveling feet are provided at the bottom of the equipment rack. Each leveling foot is constructed in a similar manner, and can be raised or lowered by turning the threaded rod with a suitable tool, e.g., a wrench.

Figure 2:
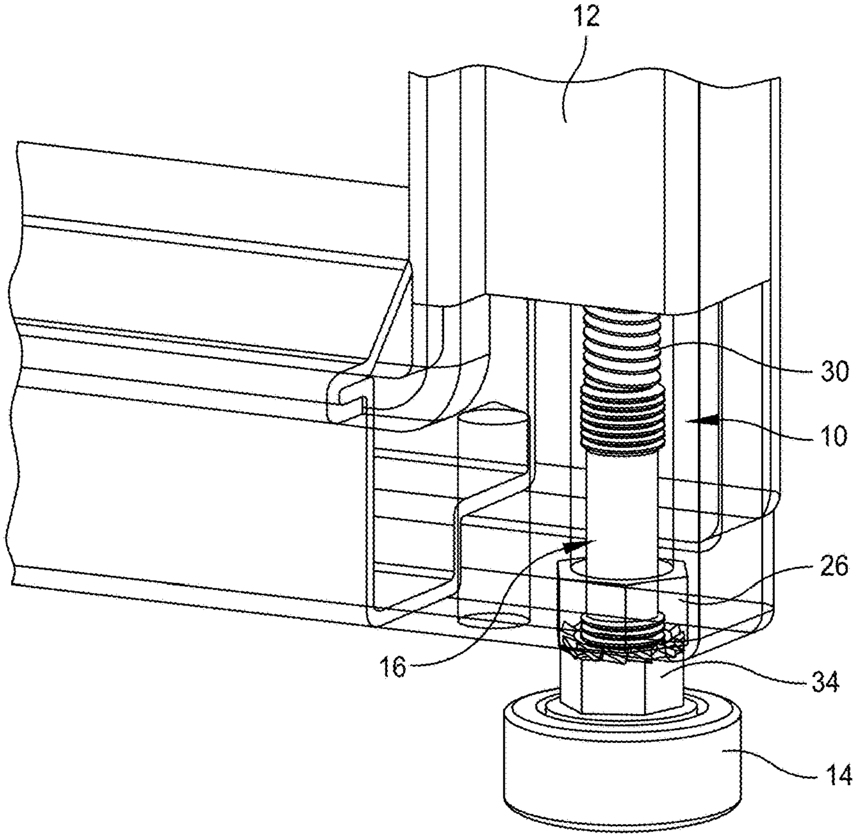
FIG. 2 is a perspective view of a portion of an equipment rack having a leveling foot assembly of an embodiment of the present disclosure showing the leveling foot assembly in a raised or retracted position.
Figure 3:
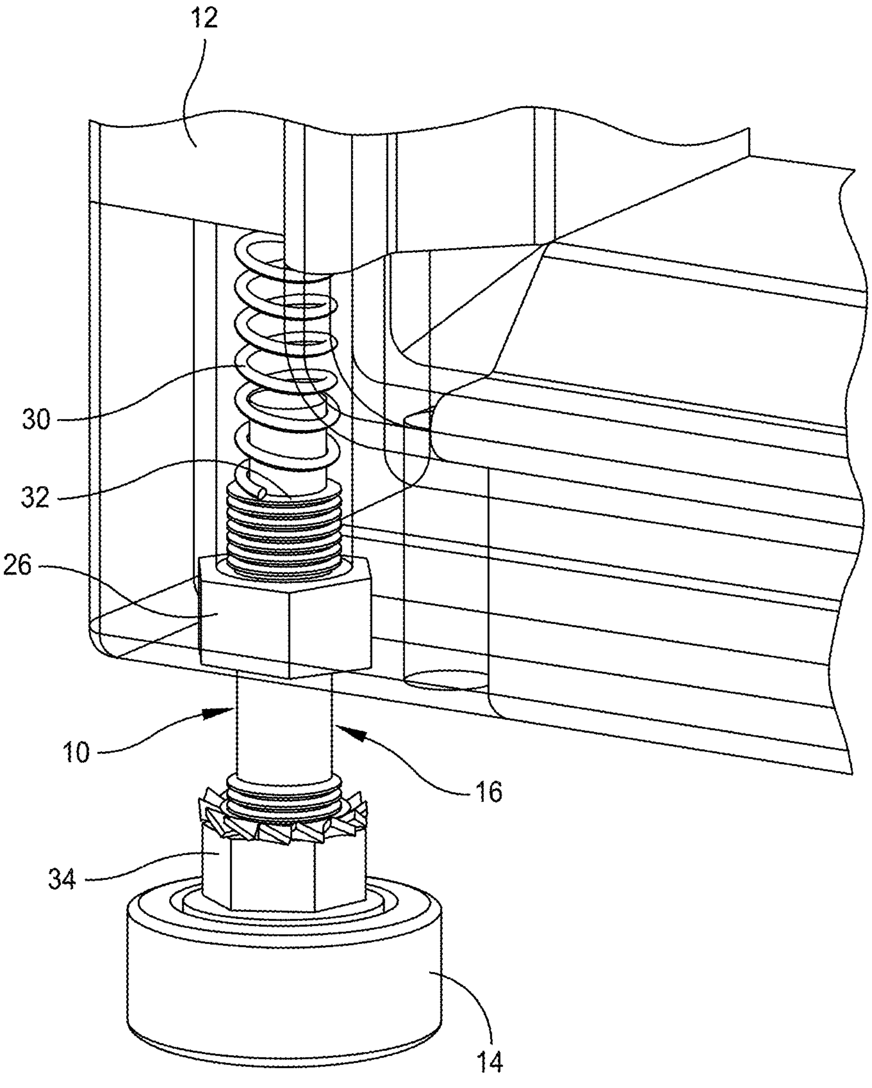
FIG. 3 is another perspective view of the leveling foot assembly shown in FIG. 2 showing the leveling foot assembly in a lowered or extended position.

Referring to FIGS. 2 and 3, an embodiment of a leveling foot assembly of an embodiment of the present disclosure is generally indicated at 10. As shown, the leveling foot assembly 10 is secured within a frame member 12 of an equipment rack. Specifically, the leveling foot assembly 10 is vertically oriented within the frame member 12, with the frame member being positioned at a corner of the equipment rack. The leveling foot assembly 10 is configured to move from a raised or retracted position (FIG. 2) to a lowered or extended position (FIG. 3). As noted above, in the raised position, the leveling foot assembly 10 is positioned above the caster wheels to enable the equipment rack to roll along a flat surface, e.g., a floor of a data center. In the lowered position, the leveling foot assembly 10 is positioned below the caster wheels to support the equipment rack.

Figure 4:
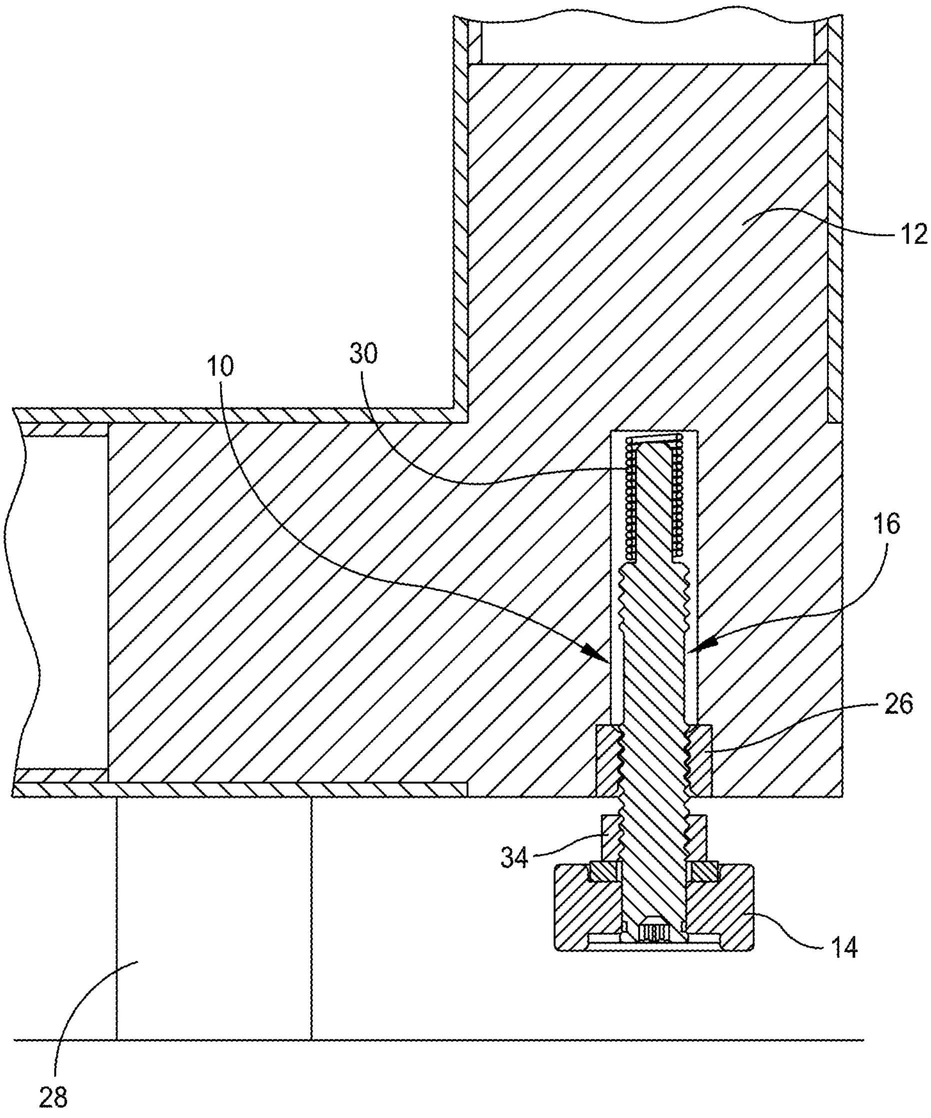
FIG. 4 is a side view of the leveling foot assembly in the raised position.
Figure 5:
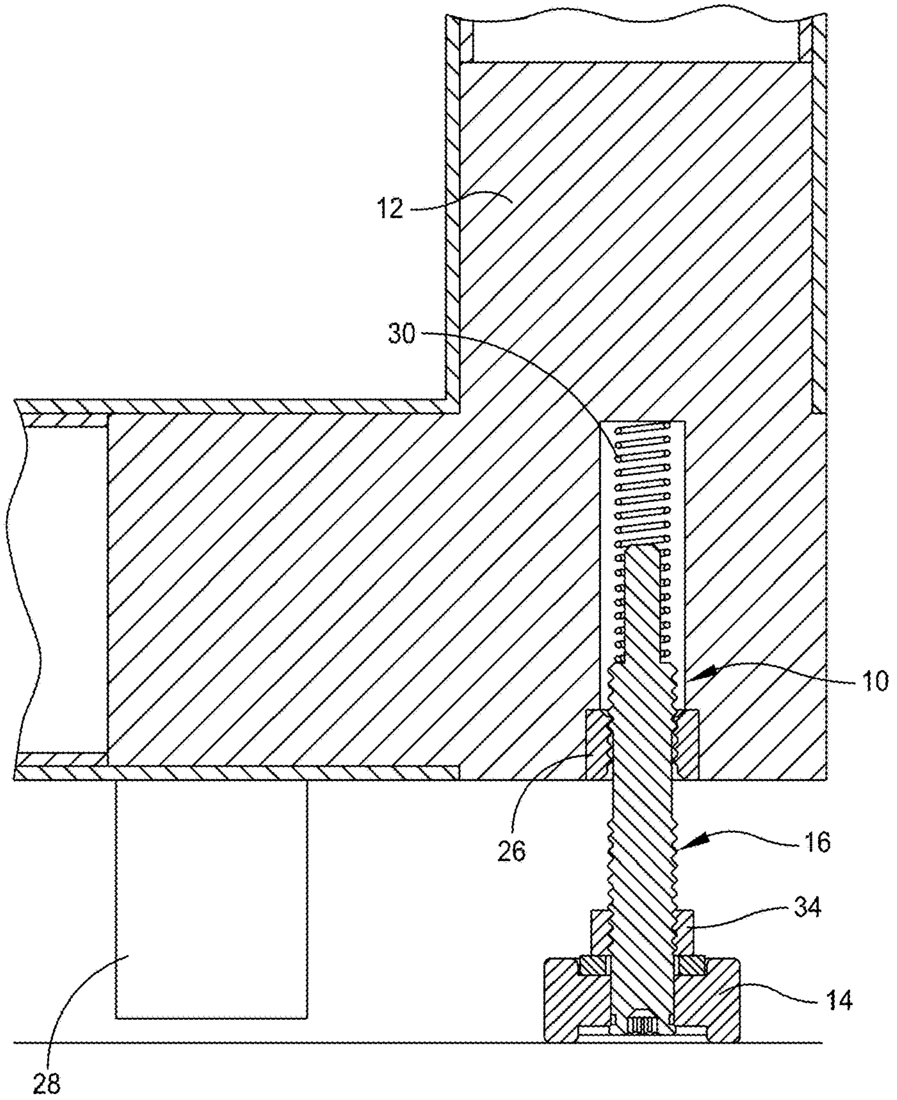
FIG. 5 is a side view of the leveling foot assembly in the lowered position.

Referring additionally to FIGS. 4 and 5, the leveling foot assembly 10 includes a foot 14 and a rod, generally indicated at 16, which is secured at one end to the foot. As shown, the foot 14 is in the shape of a disk that rests upon the generally flat surface, e.g., the floor. The foot 14 can be formed with the rod 16 as an integral, unitary part or can be secured to the rod by a suitable coupling, such as a bearing. The foot 14 can have a relatively soft, e.g., elastomeric or rubber, bottom surface to protect the flat surface it engages.

Figure 6:
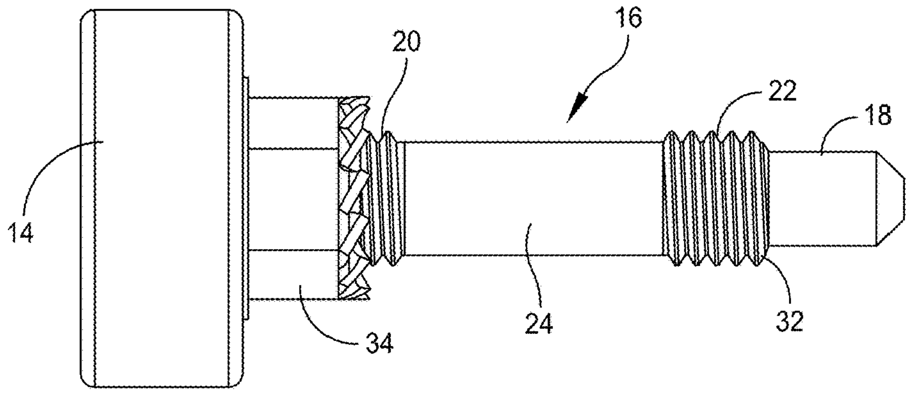
FIG. 6 is a side view of a rod of the leveling foot assembly having a leveling foot and a rotating nut configured to rotate the rod.

In one embodiment, as best shown in FIG. 6, the rod 16 includes a generally cylindrical body 18 having a first threaded portion 20 located adjacent the foot 14, a second threaded portion 22 located at a distal end of the rod, and a third threadless portion 24 positioned between the first threaded portion and the second threaded portion. In one embodiment, the third threadless portion 24 includes a smooth outer surface. As shown, the first threaded portion 20 and the second threaded portion 22 have a diameter that is greater than a diameter of the third threadless portion 24. The number of threads provided on each of the first threaded portion 20 and the second threaded portion 22 can be selected based on the size the leveling foot assembly 10 and the size of the caster wheel supporting the equipment rack. The purpose of the first threaded portion 20 and the second threaded portion 22 will become apparent as the description of the leveling foot assembly 10 proceeds.

The leveling foot assembly 10 further includes a leveling nut 26, which in one embodiment, is fixedly secured, with the rod 16 being configured to be inserted into and rotated with respect to the leveling nut. In a certain embodiment, the leveling nut 26 is fixedly secured to the frame member 12 of the equipment rack, which is best shown in FIGS. 4 and 5. In one example, the leveling nut 26 is secured to the frame member 12 of the equipment rack by welding the leveling nut to the frame member. The leveling nut 26 includes inner threads that threadably mate with the outer threads of the first threaded portion 20 and the outer threads of the second threaded portion 22.

Since the leveling nut 26 is fixed in place on the frame member 12 of the equipment rack, when the first threaded portion 20 or the second threaded portion 22 of the rod 16 threadably engages the leveling nut, the rod is configured to move axially in a up and down direction depending on whether the rod is rotated clockwise or counterclockwise when the first threaded portion or the second threaded portion engages the leveling nut. The arrangement is such that the leveling nut 26 is configured to engage the first threaded portion 20 of the rod 16 when the foot 14 is in a raised position and configured to engage the second threaded portion 22 of the leveling nut when the foot is in a lowered position. With each threaded portion 20, 22, by turning the rod 16 clockwise, a length of the rod extending below the leveling nut 26 is increased (extended), and, conversely, by turning the rod counterclockwise, a length of the rod below the leveling nut is decreased (retracted).

The inner diameter of the leveling nut 26 is larger than the outer diameter of the smooth third threadless portion 24 of the rod 16. When the inner threads of the leveling nut 26 disengage the outer threads of the first threaded portion 20, the leveling nut is freed to move over the third threadless portion 24 of the rod 16 to a position in which the inner threads of the leveling nut engages the outer threads of the second threaded portion 22.

As shown in FIGS. 2 and 4, the first threaded portion 20 of the rod 16 engages the leveling nut 26 to secure the rod in the raised (retracted) position. At any point along a length of the first threaded portion 20, when outer threads of the first threaded portion engage inner threads of the leveling nut 26, the foot 14 is raised above a caster wheel 28 to enable the caster wheel to freely roll along the flat surface upon which the equipment rack rests.

As shown in FIGS. 3 and 5, the second threaded portion 22 of the rod 16 engages the leveling nut 26 to secure the rod in the lowered (extended) position. At any point along a length of the second threaded portion 22, when outer threads of the second threaded portion engage inner threads of the leveling nut 26, the foot 14 is lowered below the caster wheel 28 to enable the leveling foot assembly 10 to support the equipment rack on the flat surface.

The leveling foot assembly 10 further includes a device to bias the rod 16 to the lowered (extended) position. Specifically, the device is configured to apply a downward force on the rod 16 as shown in the drawings. In one embodiment, the device includes a coil spring 30 configured to move the rod 16 to the lowered position when inner threads of the leveling nut 26 disengage outer threads of the first threaded portion 20. One end of the spring 30 engages the frame member 12 of the enclosure and the opposite end of the spring engages a shoulder 32 (FIG. 6) of the second threaded portion to move the rod to the lowered position. In a certain embodiment, the end of the spring 30 engaging the frame member 12 may be seated within a pocket or recess formed in the frame member. It should be noted that any type of device, including springs other than coil springs, may be provided to apply a downward force on the rod 16, thereby biasing the rod to the lowered position.

The leveling foot assembly 10 further includes a rotating nut 34 fixedly secured to the body 18 of the rod 16. The rotating nut 34 is provided for the user to rotate the rod 16 with respect to the leveling nut 26. In one embodiment, the rotating nut 34 includes a lock nut that is welded or otherwise fixedly secured to the body 18 of the rod 16. In other embodiments, the rotating nut 34 may be formed integrally with the body 18 of the rod 16. As shown, the rotating nut 34 is positioned between the foot 14 and the first threaded portion 20 of the rod 16. In the shown embodiment, the outer surface of the rotating nut 34 assumes a hexagon shape which is shaped to allow an open-ended wrench to rotate the rod 16 thereby raising or lowering the foot 14 of the leveling foot assembly 10. A person manipulating the leveling foot assembly 10 engages the rotating nut 34 with a wrench in the traditional manner to rotate the rotating nut and the rod 16 in clockwise or counterclockwise directions.

During operation, the equipment rack, prior to being deployed in a data center, is typically provided with the leveling feet 14 of the leveling feet assemblies 10 in their raised positions. To achieve this position, for each leveling foot assembly 10, the outer threads of the first threaded portion 20 are positioned adjacent to the inner threads of the leveling nut 26, which is secured in place on the frame member 12 of the equipment rack. The rod 16 is rotated in a counterclockwise direction to threadably secure the rod to the leveling nut 26. All of the leveling feet assemblies 10 of the equipment rack are moved to the raised position. This enables the equipment rack to roll along the flat surface on the caster wheels 28.

Once the equipment rack is positioned, the leveling feet assemblies 10 can be moved to the lowered positions. Specifically, for each leveling foot assembly 10, the rod 16 is rotated in a clockwise direction to threadably release the rod from the leveling nut 26. Once released, the spring 30 moves the rod 16 toward the lowered position so that the outer threads of the second threaded portion 22 engage the inner threads of the leveling nut 26. It should be understood that the person tasked with leveling the equipment rack is spared from having to rotate the rod 16 of the leveling foot assembly 10 the entire length of the rod since the rod freely moves downwardly until the outer threads of the second threaded portion 22 engage the inner threads of the leveling nut 26. In this position, the rod 16 is rotated in the clockwise position to more fully engage the outer threads of the second threaded portion 22 with the inner threads of the leveling nut 26 and to position the leveling foot assembly at a desired level or position. It should be noted that the leveling nut 26, when moving the rod 16 from the raised position to the lowered position with the aid of the spring 30, travels over a third threadless portion 24 of the rod without interference.

To return the rod 16 of each leveling foot assembly 10 to the raised position, the rod is rotated in a counterclockwise direction to disengage the outer threads of the second threaded portion 22 of the rod from the inner threads of the leveling nut 26. The rod 16 is moved against the bias of the spring 30 to the raised position to position the threads of the first threaded portion 20 next to the inner threads of the leveling nut 26. Once engaged, the rod 16 is rotated in a counterclockwise direction to threadably engage the outer threads of the first threaded portion 20 of the rod with the inner threads of a leveling nut 26.

Embodiments of the leveling foot assembly of the present disclosure can be modified depending on the size and weight of the equipment rack and/or the distance that the equipment rack is to be raised off the surface. For example, the length of the body 14 of the rod 16 can be lengthened or shortened, the diameter of the body of the rod increased or decreased, and/or the lengths of each threaded portion 20, 22 can be increased or decreased and the pitch of the thread varied.

Figure 7:
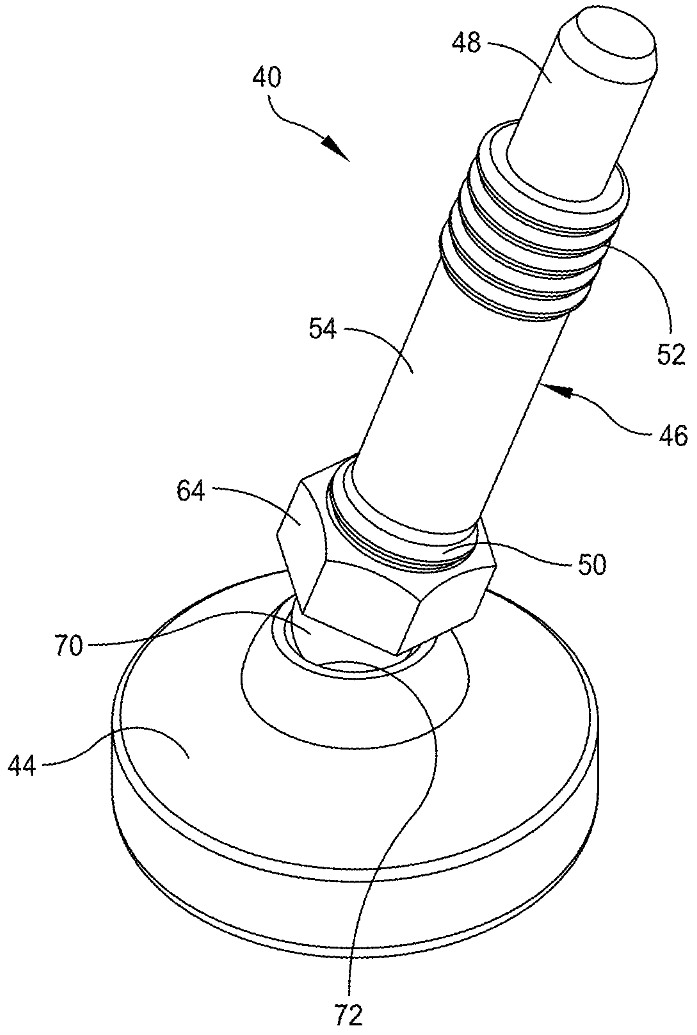
FIG. 7 is a perspective view of a leveling foot assembly of another embodiment of the present disclosure.

For example, with reference to FIG. 7, a leveling foot assembly of another embodiment of the present disclosure is generally indicated at 40. As shown, the leveling foot assembly 10 is similarly constructed as leveling foot assembly 10, and is configured to be vertically oriented within a frame member of the equipment rack at a corner of the equipment rack. Further, the leveling foot assembly 40 is configured to move from a raised position to a lowered position. The leveling foot assembly 40 includes a foot 44 and a rod, generally indicated at 46, which is secured at one end to the foot. As shown, the foot 44 is in the shape of a disk that rests upon the generally flat surface, e.g., the floor of the data center. The rod 46 includes a generally cylindrical body 48 having a first threaded portion 50 located adjacent the foot 44, a second threaded portion 52 located at a distal end of the rod, and a third threadless portion 54 positioned between the first threaded portion and the second threaded portion. The first threaded portion 50 and the second threaded portion 52 of the leveling foot assembly 40 are configured to threadably engage a leveling nut in a manner similar to how the leveling nut 26 engages the threads of the first threaded portion 20 and the second threaded portion 22 of the leveling foot assembly 10. The leveling foot assembly 40 further includes a rotating nut 64 fixedly secured to the body 48 of the rod 46 just below the second threaded portion 52. As with rotating nut 34, the rotating nut 64 is provided for the user to rotate the rod 46 with respect to the leveling nut. Although not shown, the leveling foot assembly 40 further includes a spring to bias the rod 46 to the lowered (extended) position.

The leveling foot assembly 40 is configured so that the foot 44 can rotate with respect to the body 48 of the rod 46. Specifically, the leveling foot assembly 40 includes a ball-and-socket joint to enable the rotating movement of the foot 44 with respect to the rod 46. In the shown embodiment, the end of the body 48 of the rod 46 includes a ball 70 that is press fit within a socket 72 formed in the foot 44.

Having thus described at least one embodiment of the present invention, various alternations, modifications and improvements will readily occur to those skilled in the art. Such alterations, modifications and improvements are intended to be within the scope and spirit of the invention. Accordingly, the foregoing description is by way of example only and is not intended to be limiting. The invention's limit is defined only in the following claims and equivalents thereto.

What is claimed is:

1. A leveling foot assembly, comprising:

a foot;

a rod secured to the foot, the rod including a first threaded portion, a second threaded portion, and a third threadless portion positioned between the first threaded portion and the second threaded portion, and wherein the second threaded portion comprises a shoulder;

a leveling nut configured to engage the first threaded portion of the rod when the foot is in a raised position and configured to engage the second threaded portion of the nut when the foot is in a lowered position; and a spring configured to move the rod to the lowered position, wherein the spring applies a downward force towards the shoulder of the second threaded portion to move the rod to the lowered position.

2. The leveling foot assembly of claim 1, wherein the spring is configured to move the rod to the lowered position when threads of the leveling nut disengage threads of the first threaded portion.

3. The leveling foot assembly of claim 1, wherein the spring further is configured to engage the shoulder of the second threaded portion to move the rod to the lowered position.

4. The leveling foot assembly of claim 1, wherein the leveling nut is fixedly secured and the rod rotates with respect to the leveling nut.

5. The leveling foot assembly of claim 1, wherein the leveling nut is fixedly secured to a frame of an equipment rack.

6. The leveling foot assembly of claim 1, further comprising a rotating nut fixedly secured to the rod, the rotating nut being located between the foot and the first threaded portion of the rod.

7. The leveling foot assembly of claim 1, wherein the foot, when the leveling nut engages the first threaded portion of the rod when the foot is in the raised position, is positioned above a caster wheel of an equipment rack.

8. The leveling foot assembly of claim 6, wherein the leveling nut is fixedly secured to a frame of an equipment rack and the rotating nut is fixedly secured to the rod, the rod being configured to rotate with respect to the leveling nut.

9. The leveling foot assembly of claim 1, further comprising a spring configured to bias the rod to the lowered position, the spring being configured to move the rod to the lowered position when the leveling nut disengages the first threaded portion.

10. The leveling foot assembly of claim 1, wherein the leveling nut, when moving the rod from the raised position to the lowered position, travels over the third threadless portion without interference.

11. A method of positioning a leveling foot assembly, the method comprising:

providing a rod secured to a foot, the rod being configured to be moved between a raised position and a lowered position;

rotating the rod, when the rod is in the raised position, to disengage threads of a first threaded portion of the rod from threads of a leveling nut;

once disengaged, moving the rod to the lowered position by a spring to position threads of a second threaded portion of the rod next to the threads of the leveling nut, wherein the spring applies a downward force towards a shoulder of the second threaded portion; and rotating the rod to engage threads of the second threaded portion of the rod with the threads of the leveling nut.

12. The method of claim 11, wherein the leveling nut is fixedly secured to a frame of an equipment rack.

13. The method of claim 11, wherein a rotating nut is located between the foot and the first threaded portion of the rod.

14. The method of claim 11, wherein the foot, when the leveling nut engages the first threaded portion of the rod when the foot is in the raised position, is positioned above a caster wheel of an equipment rack.

15. The method of claim 11, further comprising securing the leveling nut to a frame of an equipment rack and securing the rotating nut to the rod, the rod being configured to rotate with respect to the leveling nut.

16. The method of claim 11, wherein the leveling nut, when moving the rod from the raised position to the lowered position, travels over a third threadless portion of the rod without interference, the third threadless portion being positioned between the first threaded portion and the second threaded portion.

17. The method of claim 11, further comprising returning the rod to the raised position, wherein returning the rod to the raised position includes rotating the rod to disengage the threads of the second threaded portion of the rod from the threads of the leveling nut, moving the rod to the raised position to position the threads of the first threaded portion next to the threads of the leveling nut, and rotating the rod to engage the threads of the first threaded portion of the rod with the threads of a leveling nut.

* * * * *